(12) United States Patent
Kishimoto et al.

(10) Patent No.: US 11,806,750 B2
(45) Date of Patent: Nov. 7, 2023

(54) MEMS DEVICE (71) Applicant: Murata Manufacturing Co., Ltd., Nagaokakyo (JP)

(72) Inventors: Yutaka Kishimoto, Nagaokakyo (JP); Shinsuke Ikeuchi, Nagaokakyo (JP); Katsumi Fujimoto, Nagaokakyo (JP); Tetsuya Kimura, Nagaokakyo (JP); Fumiya Kurokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 366 days.

(21) Appl. No.: 17/161,726

(22) Filed: Jan. 29, 2021

(65) Prior Publication Data

US 2021/0146402 A1 May 20, 2021

Related U.S. Application Data

(63) Continuation of application No. PCT/JP2019/027306, filed on Jul. 10, 2019.

(30) Foreign Application Priority Data

Jul. 30, 2018 (JP) .................. 2018-142877

(51) Int. Cl.
*H10N 30/87* (2023.01)
*H10N 30/00* (2023.01)
(Continued)

(52) U.S. Cl.
CPC ....... *B06B 1/0603* (2013.01); *H10N 30/1051* (2023.02); *H10N 30/2047* (2023.02); *H10N 30/871* (2023.02); *H10N 30/877* (2023.02)

(58) Field of Classification Search
CPC ............ B06B 1/00603; H10N 30/2047; H10N 30/871; H10N 30/877; H10N 30/1051
See application file for complete search history.

(56) References Cited

U.S. PATENT DOCUMENTS

2009/0128608 A1 5/2009 Fukui
2009/0213188 A1 8/2009 Shimada et al.
(Continued)

FOREIGN PATENT DOCUMENTS

JP 2007-096248 A 4/2007
JP 2008-244725 A 10/2008
(Continued)

OTHER PUBLICATIONS

Official Communication issued in International Patent Application No. PCT/JP2019/027306, dated Oct. 1, 2019.

*Primary Examiner* — J. San Martin
(74) *Attorney, Agent, or Firm* — KEATING & BENNETT, LLP (57) ABSTRACT

A MEMS device includes a piezoelectric layer made of a piezoelectric single crystal, a first electrode on a first surface of the piezoelectric layer, and a first layer covering the first surface of the piezoelectric layer. At least a portion of the piezoelectric layer is included in a membrane portion. The first electrode is covered with the first layer and includes a recess. The piezoelectric layer includes a through hole that passes through the piezoelectric layer between a surface of the piezoelectric layer, which is opposite to the first direction, and the recess at a position corresponding to at least a portion of the first electrode.

14 Claims, 6 Drawing Sheets

(51) Int. Cl.
*H10N 30/20* (2023.01)
*B06B 1/06* (2006.01)

(56) References Cited

U.S. PATENT DOCUMENTS

| | | | | |
|---|---|---|---|---|
| 2013/0021304 A1* | 1/2013 | Zuo | ............ | H03H 9/02228 |
| | | | | 310/366 |
| 2015/0344292 A1* | 12/2015 | Lee | ............ | B81C 1/00158 |
| | | | | 257/419 |
| 2017/0301853 A1 | 10/2017 | Xia et al. | | |

FOREIGN PATENT DOCUMENTS

| | | |
|---|---|---|
| JP | 2009-218567 A | 9/2009 |
| JP | 2017-117981 A | 6/2017 |

* cited by examiner

MEMS DEVICE

CROSS REFERENCE TO RELATED APPLICATIONS

This application claims the benefit of priority to Japanese Patent Application No. 2018-142877 filed on Jul. 30, 2018 and is a Continuation Application of PCT Application No. PCT/JP2019/027306 filed on Jul. 10, 2019. The entire contents of each application are hereby incorporated herein by reference.

BACKGROUND OF THE INVENTION

1. Field of the Invention

The present invention relates to a micro electro mechanical systems (MEMS) device.

2. Description of the Related Art

A piezoelectric thin film device is described in Japanese Unexamined Patent Application Publication 2008-244725. A vertical hole called a via hole is formed in a portion where a lower surface electrode is exposed to be electrically connected to an upper surface electrode. The vertical hole extends to an interface between a piezoelectric thin film and the lower surface electrode. In Japanese Unexamined Patent Application Publication No. 2008-244725, etching of the piezoelectric thin film is performed using buffered hydrogen fluoride that is heated to form the via hole. The etching is stopped at the interface between the piezoelectric thin film and the lower surface electrode.

A metal oxide film may exist on the surface of the lower surface electrode even when the vertical hole is to be formed through the etching to make electrical connection to the lower surface electrode. The existence of this film may increase contact resistance.

SUMMARY OF THE INVENTION

Preferred embodiments of the present invention provide MEMS devices that each reduce contact resistance.

A preferred embodiment of the present invention provides a MEMS device including a piezoelectric layer made of a piezoelectric single crystal, a first electrode on a first surface of the piezoelectric layer, and a first layer covering the first surface of the piezoelectric layer. The first electrode is covered with the first layer and includes a recess. The piezoelectric layer includes a through hole that passes through the piezoelectric layer between a second surface opposite to the first surface, and the recess at a position corresponding to at least a portion of the first electrode.

According to preferred embodiments of the present invention, it is possible to reduce the contact resistance in electrical extraction from the first electrode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings. The dimensional ratios illustrated in the drawings do not necessarily represent the actual ratios accurately and there are cases in which the dimensional ratios are magnified for convenience. In the following description, the concept of "upper" or "lower" does not necessarily mean the absolute "upper" or "lower" and may mean the relative "upper" or "lower" in the orientation that is illustrated.

First Preferred Embodiment

Figure 1:
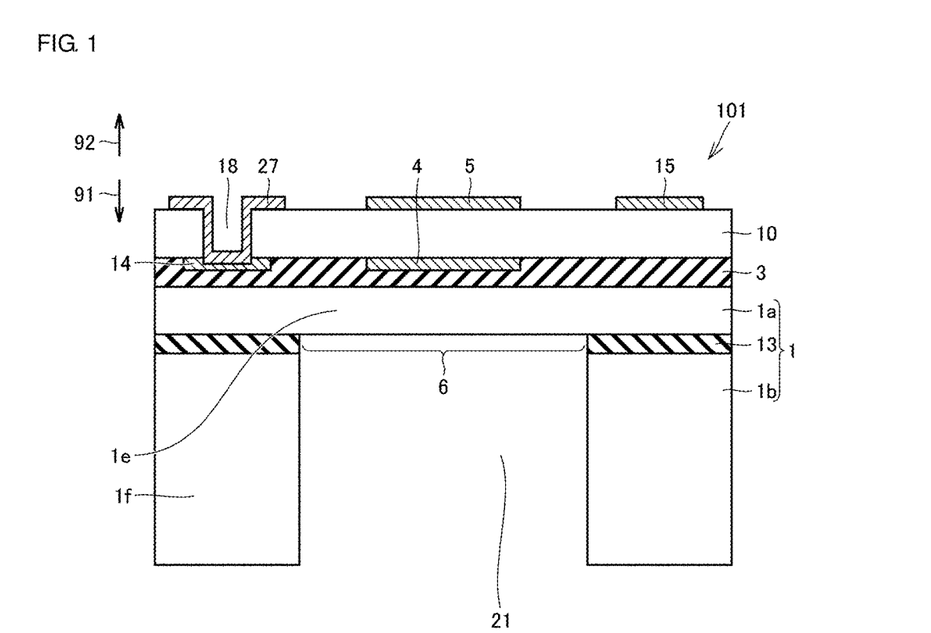
FIG. 1 is a cross-sectional view of a MEMS device according to a first preferred embodiment of the present invention.
Figure 2:
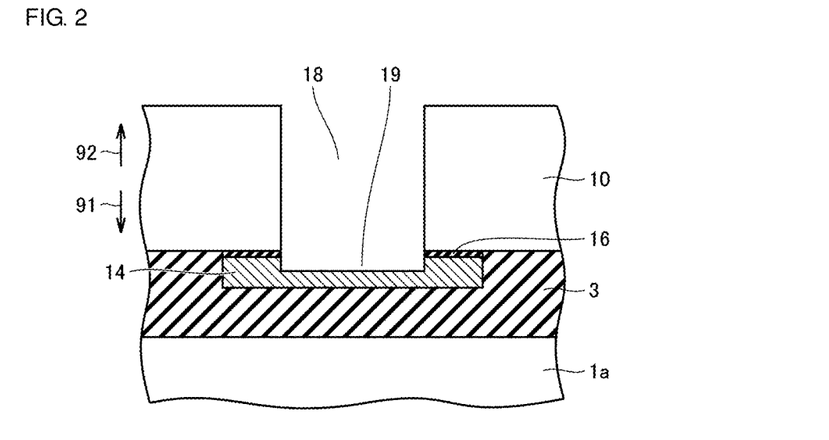
FIG. 2 is a diagram resulting from enlargement of the vicinity of a through hole in FIG. 1.

A MEMS device according to a first preferred embodiment of the present invention will now be described with reference to FIG. 1 and FIG. 2. A cross-sectional view of a MEMS device 101 in the present preferred embodiment is illustrated in FIG. 1. A diagram resulting from enlargement of the vicinity of a through hole 18 in FIG. 1 is illustrated in FIG. 2. However, a second electrode 27 is removed in FIG. 2 for convenience.

The MEMS device 101 includes a membrane portion 6. The membrane portion 6 is a portion that is thin and is likely to be deformed in the MEMS device 101. In the example illustrated in FIG. 1, a substrate 1 includes a thin portion 1e and a thick portion 1f. The thin portion 1e is thinner than the thick portion 1f and is more likely to be deformed, as compared with the thick portion 1f. When the MEMS device 101 is viewed from below, the thin portion 1e is surrounded by the thick portion 1*f*. In the example illustrated in FIG. 1, the membrane portion 6 includes the thin portion 1*e*. Providing the thin portion 1*e* in an area surrounded by the thick portion 1*f* produces the substrate 1 including a space 21.

The MEMS device 101 includes a piezoelectric layer 10 made of a piezoelectric single crystal, a first electrode 14 on a first surface in a first direction 91 of the piezoelectric layer (a first surface of the piezoelectric layer 10), and an intermediate layer 3 that is a first layer and that covers the first surface in the first direction 91 of the piezoelectric layer 10. The "first direction 91" here is one of the two orientations of the laminated direction of the MEMS device 101. The first direction 91 refers to the lower side in FIG. 1, as illustrated by an arrow and a reference numeral.

The "piezoelectric material" here may preferably be, for example, $LiTaO_3$, $LiNbO_3$, ZnO, or lead magnesium niobate-lead titanate (PMN-PT). The intermediate layer 3 is an insulating layer. The intermediate layer 3 may preferably be made of, for example, $SiO_2$. The intermediate layer 3 may include multiple layers. The intermediate layer 3 may include a metal layer. In the MEMS device 101, a silicon-on-insulator (SOI) substrate, for example, is preferably used as the substrate 1. In the example illustrated in FIG. 1, the membrane portion 6 includes a portion of the piezoelectric layer 10 and a portion of the intermediate layer 3, in addition to the thin portion 1*e* of the substrate 1. The substrate 1 includes an active layer 1*a* and a base portion 1*b*, and an insulating film 13 is interposed between the active layer 1*a* and the base portion 1*b*. At least a portion of the piezoelectric layer 10 is included in the membrane portion 6. The first electrode 14 is covered with the first layer and includes a recess 19. The piezoelectric layer 10 includes a through hole 18 that passes through the piezoelectric layer 10 between the second surface in a second direction 92, which is opposite to the first direction 91, and the recess 19 at a position corresponding to at least a portion of the first electrode 14.

In the example illustrated here, an upper electrode 5 is formed on the top surface of the piezoelectric layer 10 and a lower electrode 4 is provided on the bottom surface of the piezoelectric layer 10. In the example illustrated here, the MEMS device 101 includes the second electrode 27. The second electrode 27 is connected to the piezoelectric layer 10 and the recess 19 in the through hole 18.

Although the lower electrode 4 and the first electrode 14 are illustrated in different locations in FIG. 1, the lower electrode 4 and the first electrode 14 may be electrically connected to each other and may be physically connected to each other with a conductor directly or indirectly. In the example illustrated in FIG. 1, the lower electrode 4 is connected to the first electrode 14 at a position that is not illustrated in the cross-sectional view. An electrode 15 is provided on the top surface of the piezoelectric layer 10. The same connection structure between the lower electrode 4 and the first electrode 14 is preferably used for the connection structure between the upper electrode 5 and the electrode 15. Although the upper electrode 5 and the electrode 15 are illustrated in different locations in FIG. 1, the upper electrode 5 and the electrode 15 may be electrically connected to each other. In the example illustrated in FIG. 1, the upper electrode 5 is connected to the electrode 15 at a position that is not illustrated in the cross-sectional view.

Although a conductor connected to the first electrode 14 is not illustrated in FIG. 1 and FIG. 2, a conductor connected to the first electrode 14 through the through hole 18 may be practically provided.

In the present preferred embodiment, providing a voltage difference between the upper electrode 5 and the lower electrode 4 causes the piezoelectric layer 10 to be deformed. The MEMS device 101 is preferably, for example, a piezoelectric micromachined ultrasonic transducer (PMUT) using bending vibration.

Since the first electrode 14 includes the recess 19 communicating with the through hole 18 on an extension of the through hole 18 in the present preferred embodiment, contact resistance is able to be reduced in electrical extraction from the first electrode 14.

As illustrated in FIG. 2, an oxide film 16 may be naturally formed on the top surface of the first electrode 14. When etching is stopped at an extent at which the top surface of the first electrode 14 is exposed, the top surface of the first electrode 14 is covered with the oxide film 16 and the contact resistance may be increased due to the oxide film 16. However, since the recess 19 extends into the first electrode 14 in the manner illustrated in FIG. 2 in the present preferred embodiment, electrical connection to the first electrode 14 is less likely to be affected by the oxide film 16 to enable a reduction in the contact resistance.

The configuration is exemplified in the present preferred embodiment, in which the substrate 1 includes the thin portion 1*e* and the membrane portion 6 includes the thin portion 1*e*. However, a configuration may be provided, in which the substrate 1 does not include the thin portion 1*e*. In other words, a configuration may be provided, in which the thickness of the thin portion 1*e* is zero. In this case, the membrane portion 6 is configured so as not to include the thin portion 1*e* of the substrate 1. Even in this case, the membrane portion 6 includes a portion of the piezoelectric layer 10 and a portion of the intermediate layer 3. The intermediate layer 3 may be exposed from the bottom surface of the membrane portion 6.

As described in the present preferred embodiment, the second electrode 27 connected to the recess 19 may be provided in the through hole 18. This configuration enables the electrical extraction from the first electrode 14 to be easily performed.

Manufacturing Method

A non-limiting example of a method of manufacturing the MEMS device according to the present preferred embodiment will now be described.

Figure 3:
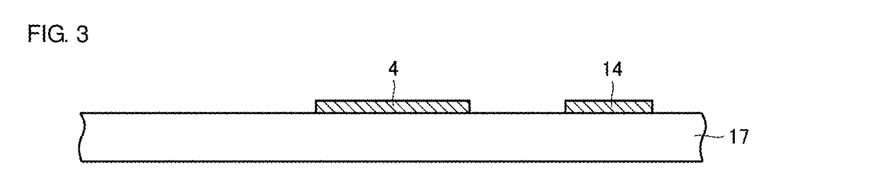
FIG. 3 is a first explanatory diagram of a method of manufacturing the MEMS device according to the first preferred embodiment of the present invention.

First, as illustrated in FIG. 3, a piezoelectric single crystal substrate 17 is prepared. The piezoelectric single crystal substrate 17 may preferably be, for example, a substrate made of $LiTaO_3$ or $LiNbO_3$. Next, the lower electrode 4 and the first electrode 14 are formed through film formation into a desired pattern on one surface of the piezoelectric single crystal substrate 17. The lower electrode 4 and the first electrode 14 may preferably be made of, for example, Pt or the like. For example, a Ti layer, which defines and functions as a close contact layer, may be interposed on the interface between the piezoelectric single crystal substrate 17 and the lower electrode 4 and the first electrode 14.

Figure 4:
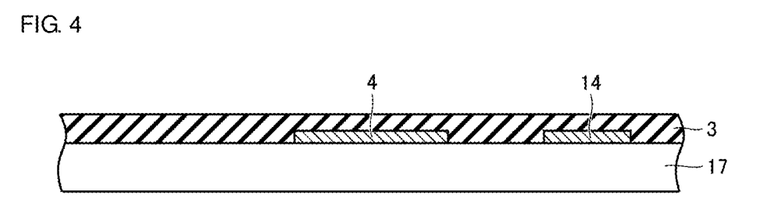
FIG. 4 is a second explanatory diagram of the method of manufacturing the MEMS device according to the first preferred embodiment of the present invention.

As illustrated in FIG. 4, the intermediate layer 3 is formed so that the lower electrode 4 is covered with the intermediate layer 3. The intermediate layer 3 may preferably be made of, for example, $SiO_2$ or the like. After the intermediate layer 3 is formed, the surface of the intermediate layer 3 is flattened through, for example, chemical mechanical polishing (CMP).

Figure 5:
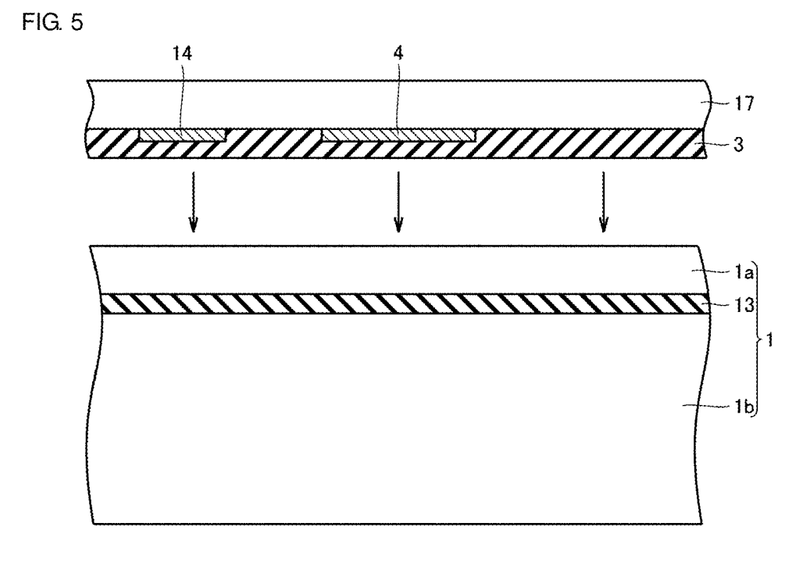
FIG. 5 is a third explanatory diagram of the method of manufacturing the MEMS device according to the first preferred embodiment of the present invention.

As illustrated in FIG. 5, the above structure is bonded to the substrate 1. The bonding is performed so that the intermediate layer 3 is in contact with the substrate 1. The bonding results in a state illustrated in FIG. 6. A metal layer may be interposed on the interface with which the intermediate layer 3 is joined to the substrate 1. The substrate 1 may preferably be, for example, a silicon substrate. An intermediate layer may be provided in the substrate 1. The intermediate layer may be formed through, for example, thermal oxidation of a portion of the substrate 1.

Figure 6:
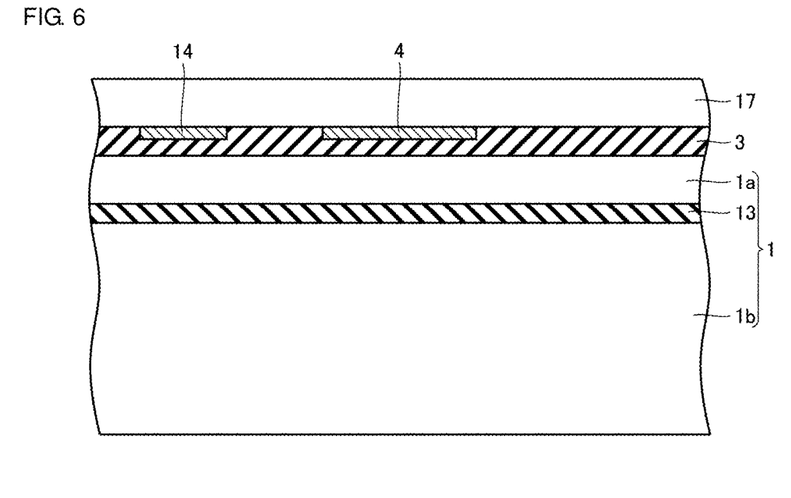
FIG. 6 is a fourth explanatory diagram of the method of manufacturing the MEMS device according to the first preferred embodiment of the present invention.

The piezoelectric single crystal substrate 17 is subjected to abrasion, peeling-off, or both of the abrasion and the peeling-off to decrease the thickness of the piezoelectric single crystal substrate 17 to a desired film thickness. For example, grinding or the CMP may be used as the method of decreasing the thickness of the piezoelectric single crystal substrate 17 through the abrasion. When the thickness of the piezoelectric single crystal substrate 17 is decreased through the peeling-off, a layer-to-be-peeled-off is provided in the piezoelectric single crystal substrate 17 in advance through ion implantation. In this case, desired polarization is capable of being achieved by controlling, for example, the power, the depth, or the like of the ion implantation. In addition, annealing may be performed to recover the crystallinity or to control the polarization.

Figure 7:
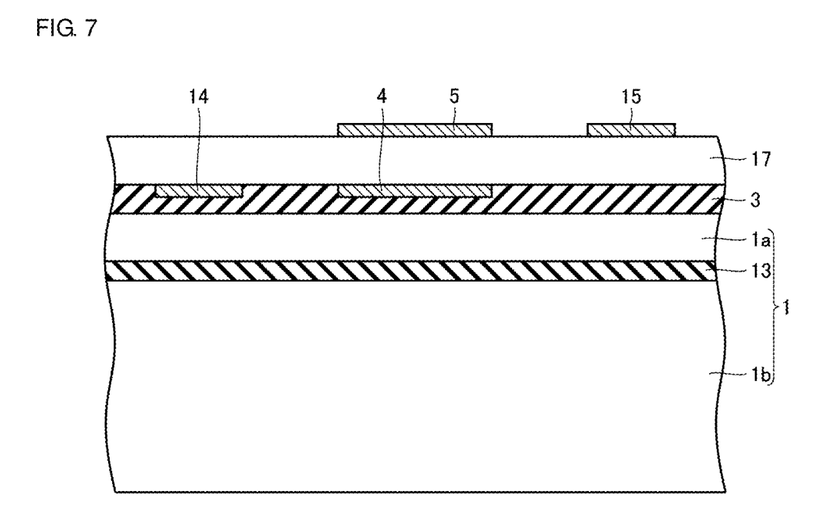
FIG. 7 is a fifth explanatory diagram of the method of manufacturing the MEMS device according to the first preferred embodiment of the present invention.

As illustrated in FIG. 7, the upper electrode 5 is formed through the film formation into a desired pattern on the top surface of the piezoelectric single crystal substrate 17. The upper electrode 5 may preferably be made of, for example, Pt or the like. For example, a Ti layer, which defines and functions as the close contact layer, may be interposed on the interface between the piezoelectric single crystal substrate 17 and the upper electrode 5.

Figure 8:
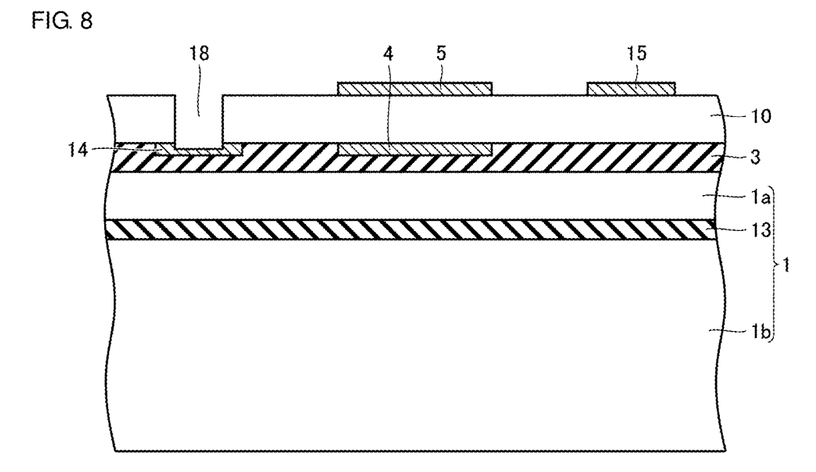
FIG. 8 is a sixth explanatory diagram of the method of manufacturing the MEMS device according to the first preferred embodiment of the present invention.

As illustrated in FIG. 8, the through hole 18 is formed by the etching to make the electrical connection from the first electrode 14. The through hole 18 passes through the piezoelectric single crystal substrate 17. In the formation of the through hole 18, the first electrode 14 is also slightly removed. Wiring for electrical connection to the first electrode 14 may be formed on the through hole 18.

Figure 9:
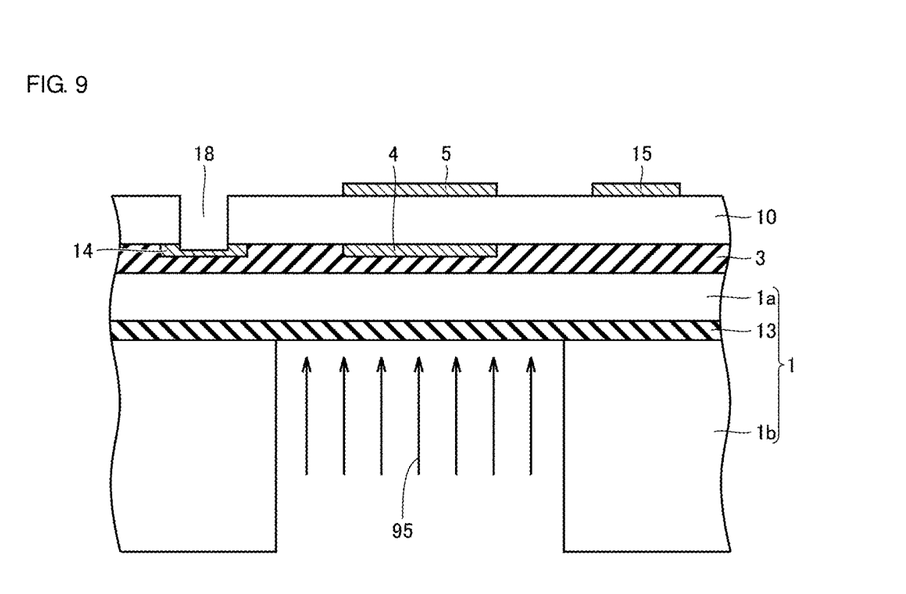
FIG. 9 is a seventh explanatory diagram of the method of manufacturing the MEMS device according to the first preferred embodiment of the present invention.

The piezoelectric single crystal substrate 17, the intermediate layer 3, and the substrate 1 are formed into desired patterns. As illustrated by arrows 95 in FIG. 9, a portion or the entire or substantially the entire the substrate 1 is removed through deep reactive-ion etching (DRIE) to form the membrane portion 6. In addition, the insulating film 13 is removed on the bottom surface of the membrane portion 6 and the second electrode 27 is formed to manufacture the MEMS device 101 illustrated in FIG. 1.

A structure may be provided, in which the insulating film 13 remains on the bottom surface of the membrane portion 6.

Second Preferred Embodiment

Figure 10:
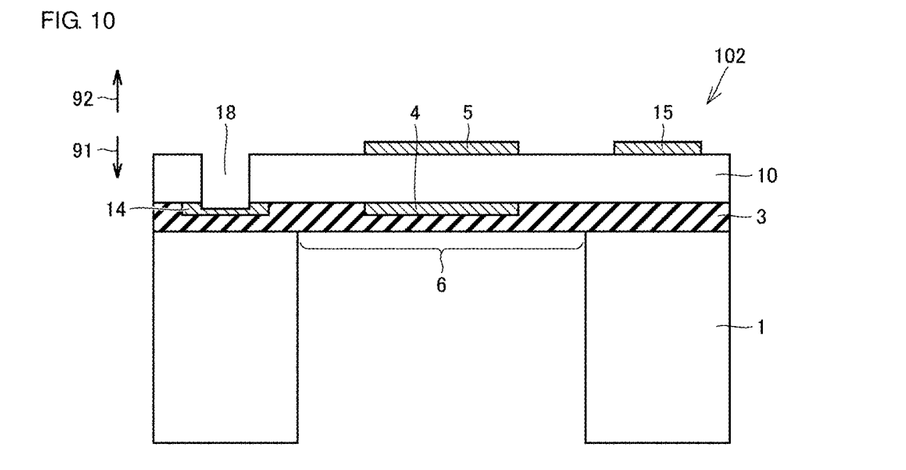
FIG. 10 is a cross-sectional view of a MEMS device according to a second preferred embodiment of the present invention.

A MEMS device according to a second preferred embodiment of the present invention will now be described with reference to FIG. 10. A cross-sectional view of a MEMS device 102 in the present preferred embodiment is illustrated in FIG. 10. Enlargement of the vicinity of the through hole 18 in FIG. 10 results in the diagram in FIG. 2. The MEMS device 102 utilizes bulk waves. The MEMS device 102 includes the through hole 18, similar to the MEMS device 101 described in the first preferred embodiment, and the first electrode 14 includes the recess 19 communicating with the through hole 18 on an extension of the through hole 18.

Also in the present preferred embodiment, since the piezoelectric layer 10 includes the through hole 18 and the first electrode 14 includes the recess 19 communicating with the through hole 18 on an extension of the through hole 18, the contact resistance is able to be reduced in the electrical extraction from the first electrode 14.

Third Preferred Embodiment

Figure 11:
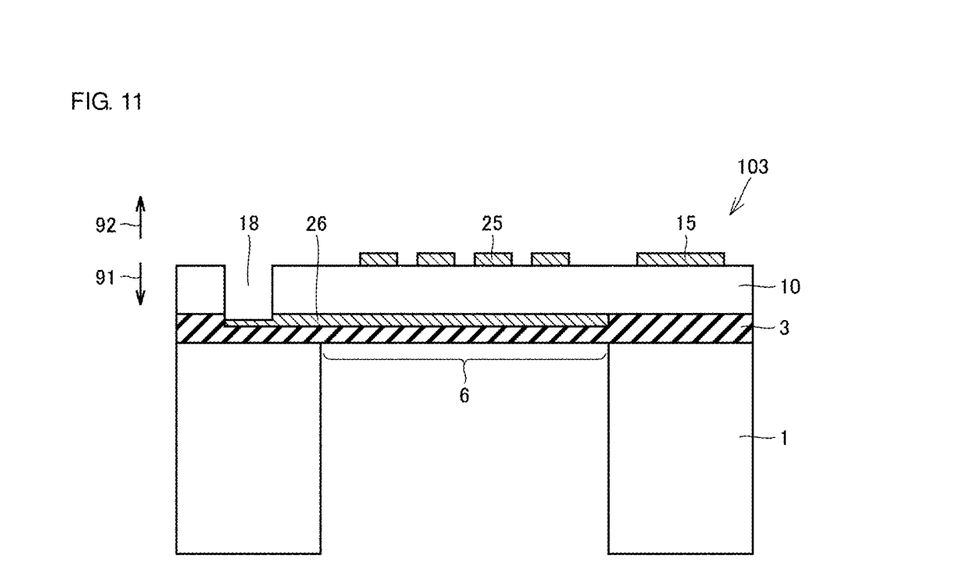
FIG. 11 is a cross-sectional view of a MEMS device according to a third preferred embodiment of the present invention.
Figure 12:
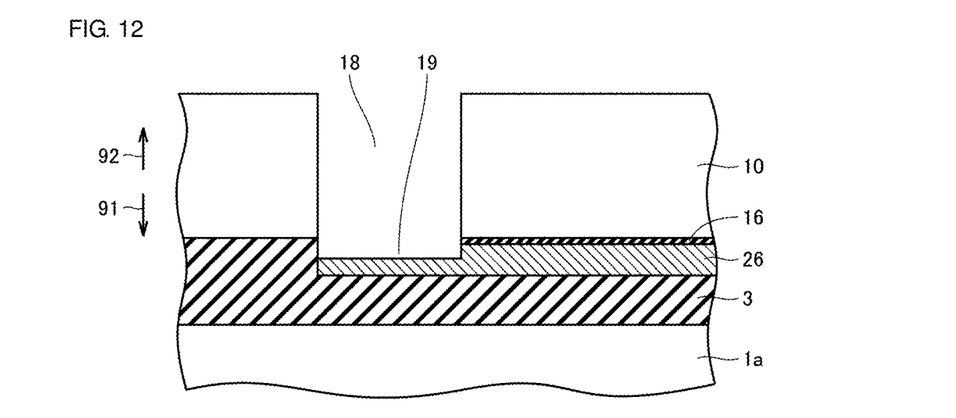
FIG. 12 is a diagram resulting from enlargement of the vicinity of a through hole in FIG. 11.

A MEMS device according to a third preferred embodiment of the present invention will now be described with reference to FIG. 11. A cross-sectional view of a MEMS device 103 in the present preferred embodiment is illustrated in FIG. 11. A diagram resulting from enlargement of the vicinity of the through hole 18 in FIG. 11 is illustrated in FIG. 12. The MEMS device 103 utilizes plate waves. Various waves excited by a piezoelectric thin plate having a film thickness of or less are collectively called the "plate waves" here, where the wavelength of the plate waves that are excited is denoted by 1X. In the MEMS device 103, interdigital electrodes 25 and the electrode 15 are provided on the top surface of the piezoelectric layer 10. The electrode 15 may be electrically connected to the interdigital electrodes 25.

A ground conductor 26 is provided as the first electrode on the bottom surface of the piezoelectric layer 10.

The piezoelectric layer 10 includes the through hole 18 and the ground conductor 26, which is the first electrode, includes the recess 19 communicating with the through hole 18 on an extension of the through hole 18. The recess 19 may be a cutout provided at an end of the first electrode, as illustrated in FIG. 12. The ground conductor 26 may be used as a floating electrode.

Also in the present preferred embodiment, since the piezoelectric layer 10 includes the through hole 18 and the first electrode includes the recess 19 communicating with the through hole 18 on an extension of the through hole 18, the contact resistance is able to be reduced in the electrical extraction from the first electrode.

The following matters preferably are common to the respective preferred embodiments described above. The first electrode preferably has an etching rate lower than that of the piezoelectric material. With this configuration, it is possible to terminate the etching only by forming a necessary recess without excessively removing the first electrode.

The first electrode is preferably an epitaxial growth layer. Since side etch is less likely to occur in the etching when the epitaxial growth layer is used as the first electrode, it is possible to easily form an excellent recess.

The first electrode may be a multilayer body including two or more metal films. The first electrode may preferably have, for example, a two-layer structure including a Ti film and a Ni film. The Ti film is provided as a close contact layer and the Ni film is provided on the Ti film. The Ni film may be formed through epitaxial growth. When the first electrode has the two-layer structure including the Ti film and the Ni film, the vicinity of the through hole 18 has, for example, a structure illustrated in FIG. 13. The recess 19 provided on an extension of the through hole 18 passes through a Ti film 14*b* provided as the close contact layer and enters into a Ni film 14*a*. The first electrode may have a three-layer structure, for example. The first electrode may have a structure including, for example, an Al film or a Pt film as a metal film having a low resistivity. When the first electrode has the three-layer structure, the first electrode may include the Al film or the Pt film, in addition to the Ti film and the Ni film.

Figure 13:
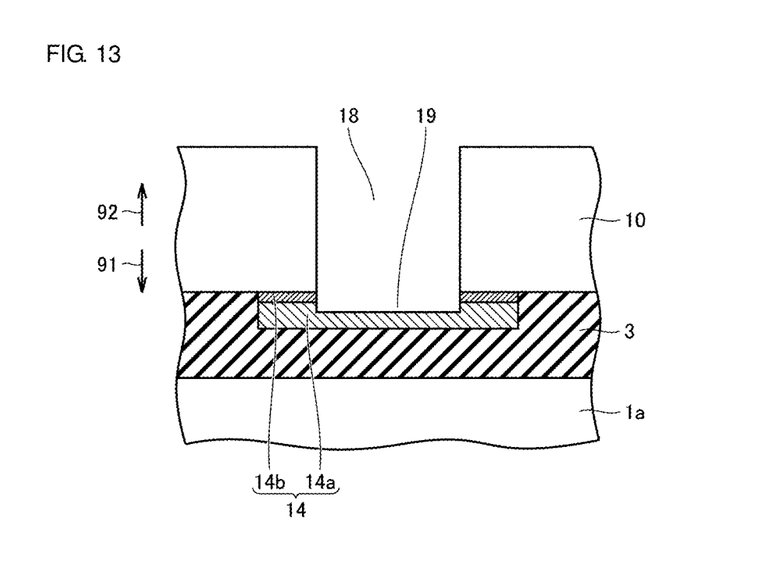
FIG. 13 is a diagram resulting from enlargement of the vicinity of the through hole when a first electrode has a laminated structure including two types of metal films.

As illustrated in FIG. 13, it is preferable that the first electrode has a laminated structure including the Ni film 14*a* and the Ti film 14*b* on the piezoelectric layer 10 side of the Ni film 14*a*, the recess 19 passes through the Ti film 14*b*, and the bottom of the recess 19 is in the Ni film 14*a*. In other words, the surface of the recess 19 is preferably positioned below the interface between the Ni film 14a and the Ti film 14b in the laminated direction. With this configuration, it is possible to easily ensure the electrical connection with the Ni film 14a to reduce the contact resistance.

Multiple preferred embodiments, among the above preferred embodiments, may be appropriately combined.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A micro electro mechanical systems device comprising:
a piezoelectric layer;
a first electrode on a first surface of the piezoelectric layer; and
a first layer covering the first surface of the piezoelectric layer; wherein
the first electrode is covered with the first layer, and the first electrode includes a recess; and
the piezoelectric layer includes a through hole that passes through the piezoelectric layer between a second surface, which is opposite to the first surface, and the recess at a position corresponding to at least a portion of the first electrode.

2. The micro electro mechanical systems device according to claim 1, wherein the first electrode has an etching rate lower than that of the piezoelectric material.

3. The micro electro mechanical systems device according to claim 1, wherein the first electrode is an epitaxial growth layer.

4. The micro electro mechanical systems device according to claim 1, further comprising a second electrode connected to the recess in the through hole.

5. The micro electro mechanical systems device according to claim 1, wherein the first electrode has a laminated structure including a Ni film and a Ti film at a piezoelectric layer side of the Ni film, and a surface of the recess is below an interface between the Ni film and the Ti film in a laminated direction.

6. The micro electro mechanical systems device according to claim 1, wherein the piezoelectric layer is made of a piezoelectric single crystal.

7. The micro electro mechanical systems device according to claim 1, further comprising a lower electrode on the first surface of the piezoelectric layer and an upper electrode on the second surface of the piezoelectric layer.

8. The micro electro mechanical systems device according to claim 1, further comprising:
interdigital electrodes on the second surface of the piezoelectric layer; wherein
the first electrode is a ground conductor.

9. The micro electro mechanical systems device according to claim 8, wherein the recess is defined by a cutout at an end of the ground conductor.

10. The micro electro mechanical systems device according to claim 1, wherein the piezoelectric layer includes at least one of $LiTaO_3$, $LiNbO_3$, $ZnO$, or lead magnesium niobate-lead titanate.

11. The micro electro mechanical systems device according to claim 1, wherein the first layer is made of $SiO_2$.

12. The micro electro mechanical systems device according to claim 1, further comprising a substrate on which the piezoelectric layer is provided.

13. The micro electro mechanical systems device according to claim 12, wherein the substrate is a silicon-on-insulator substrate.

14. The micro electro mechanical systems device according to claim 12, wherein
the substrate includes an active portion and a base portion; and
an insulating layer is interposed between the active portion and the base portion.

* * * * *